(12) United States Patent
Violette et al.

(10) Patent No.: US 7,176,086 B2
(45) Date of Patent: Feb. 13, 2007

(54) INTERCONNECTING CONDUCTIVE LAYERS OF MEMORY DEVICES

(75) Inventors: Michael Violette, Boise, ID (US); Mark A. Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 11/007,138

(22) Filed: Dec. 7, 2004

(65) Prior Publication Data

US 2005/0202622 A1    Sep. 15, 2005

Related U.S. Application Data

(62) Division of application No. 10/797,495, filed on Mar. 10, 2004, now Pat. No. 6,861,697.

(51) Int. Cl.
*H01L 21/336*    (2006.01)

(52) U.S. Cl. ................ 438/258; 438/596; 257/E21.691
(58) Field of Classification Search ................ 438/258, 438/267, 304, 596; 257/E21.691
See application file for complete search history.

(56) References Cited

U.S. PATENT DOCUMENTS

| 6,187,636 | B1 * | 2/2001 | Jeong .......................... 438/267 |
| 6,261,907 | B1 * | 7/2001 | Chang .......................... 438/258 |
| 6,777,294 | B2 | 8/2004 | Park | |

\* cited by examiner

*Primary Examiner*—Chandra Chaudhari
(74) *Attorney, Agent, or Firm*—Leffert, Jay & Polglaze P.A.

(57) ABSTRACT

Field-effect transistors, select gates, and select lines have first and second conductive layers separated by an interlayer dielectric layer. A conductive strap is disposed on either side of the first and second conductive layers. Each strap electrically interconnects the first and second conductive layers.

30 Claims, 10 Drawing Sheets

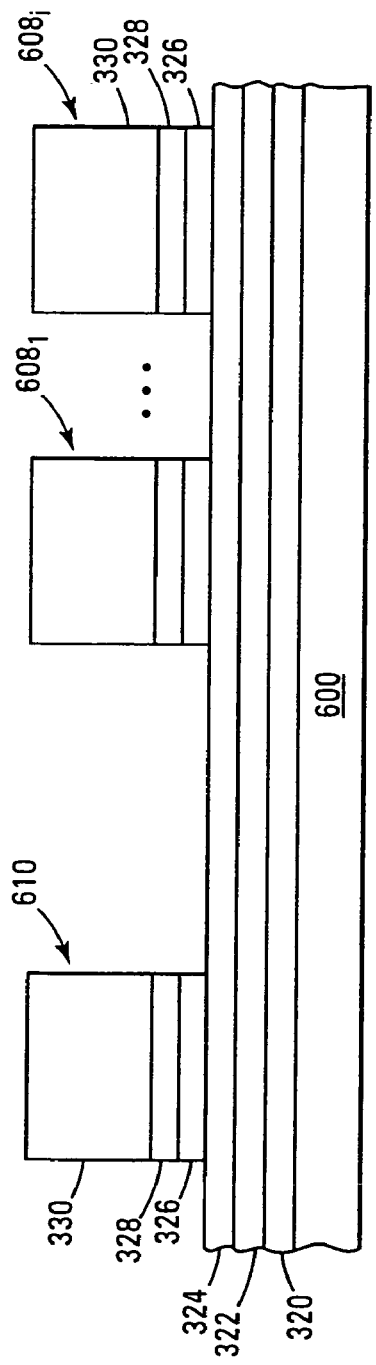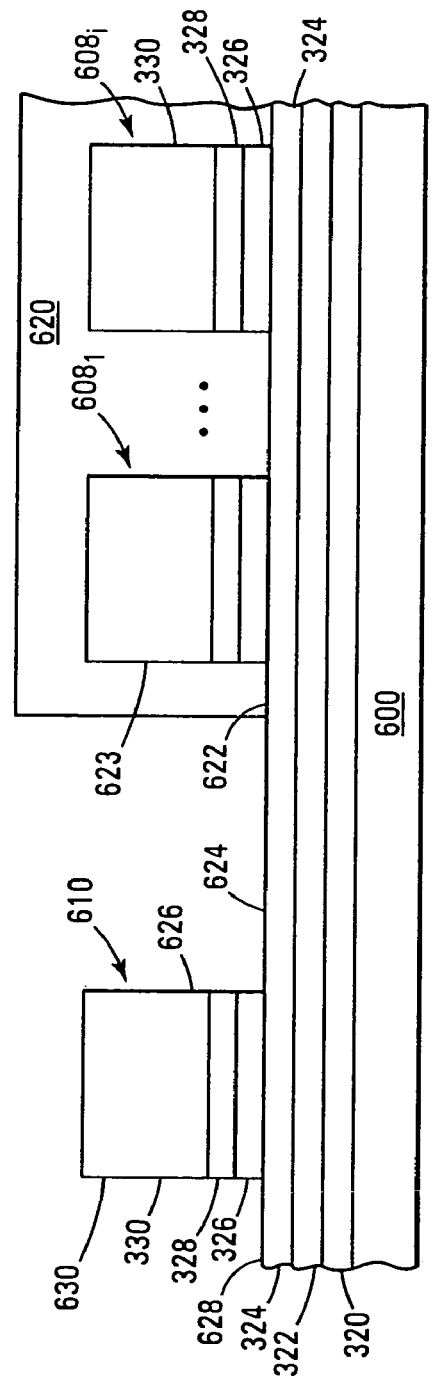

INTERCONNECTING CONDUCTIVE LAYERS OF MEMORY DEVICES

CROSS-REFERENCE TO RELATED APPLICATION

This is a divisional application of application Ser. No. 10/797,495, titled INTERCONNECTING CONDUCTIVE LAYERS OF MEMORY DEVICES, filed Mar. 10, 2004 now U.S. Pat. No. 6,681,697, which application is assigned to the assignee of the present invention and the entire contents of which are incorporated herein by reference.

TECHNICAL FIELD OF THE INVENTION

The present invention relates generally to memory devices and in particular the present invention relates to interconnecting conductive layers of memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form of the basic memory cell configuration in which each is arranged. Typically, for NOR flash memory devices, the control gate of each memory cell of a row of the array is connected to a word-select line, and the drain region of each memory cell of a column of the array is connected to a bit line. The memory array for NOR flash memory devices is accessed by a row decoder activating a row of floating-gate memory cells by selecting the word-select line coupled to their gates. The row of selected memory cells then place their data values on the column bit lines by flowing a differing current, depending upon their programmed states, from a coupled source line to the coupled column bit lines.

The array of memory cells for NAND flash memory devices is also arranged such that the control gate of each memory cell of a row of the array is connected to a word-select line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word-select line coupled to a control gate of a memory cell. In addition, the word-select lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

The floating gate field effect transistors forming the floating gate memory cells of NOR and NAND memory devices typically include a tunnel dielectric layer, e.g., a tunnel oxide, disposed on a substrate, such as silicon. A floating gate layer, e.g., a first polysilicon layer, overlies the tunnel dielectric layer, and an interlayer dielectric layer overlies the floating gate layer. A control gate (or word line) overlies the interlayer dielectric layer and usually consists of a second polysilicon layer disposed on the interlayer dielectric layer and a conductive layer, such as a metal or polycide layer, disposed on the second polysilicon layer. A protective cap layer typically overlies the metal or polycide layer.

For NOR memory devices field-effect transistors are often disposed about the periphery of the NOR memory array and are connected to the NOR memory array for controlling operation of the NOR memory array. For example, such field-effect transistors are often used to access rows and columns of the NOR memory array. For NAND memory devices, field-effect transistors are often connected on either end of the NAND strings and used as select gates.

Typically, some field-effect transistors are formed concurrently with the floating-gate transistors and thus the field-effect transistors often have the same layers as the floating-gate transistors. For example, the field-effect transistors include the first polysilicon layer overlying a gate dielectric layer disposed on the substrate, the interlayer dielectric layer overlying the first polysilicon layer, the second polysilicon layer overlying the interlayer dielectric layer, the metal or polycide layer overlying the second polysilicon layer, and the protective cap layer typically overlying the metal or polycide layer. However, it is desirable that the field-effect transistors and the floating-gate transistors operate differently. That is, a floating gate should not hinder the field-effect transistors. Therefore, the floating gate needs to be eliminated.

Shorting the first and second polysilicon layers together is one way to eliminate the floating gate. For NAND memory devices, shorting the first and second polysilicon layers together is usually accomplished by forming a metal or polycide strap on the protective cap layer. A first conductor is passed through the protective cap layer, the metal or polycide layer, the second polysilicon layer, and the interlayer dielectric layer and is connected between the strap and first polysilicon layer. A second conductor is passed through the protective cap layer and the metal or polycide layer and is connected between the strap and second polysilicon layer so that the strap shorts the first and second polysilicon layers together. The shorted-together first and second polysilicon layers typically forms a select line that extends over several columns of the NAND array. However, this method of shorting the first and second polysilicon layers together effectively shorts the first and second polysilicon layers together at a single region of the select line. This results in select lines with relatively high resistance because the select lines are primarily of polysilicon. The relatively high resistance acts to slow down the operation of the select gates along the select line. Moreover, this method of shorting is not normally used for the field-effect transistors that are disposed about the periphery of NOR memory devices, as the field-effect transistors generally do not share a common control gate.

For the reasons stated above, and for other reasons stated below which will become apparent to those skilled in the art upon reading and understanding the present specification, there is a need in the art for alternative NOR and NAND memory devices.

SUMMARY

The above-mentioned problems with NOR and NAND memory devices and other problems are addressed by the present invention and will be understood by reading and studying the following specification.

For one embodiment, the invention provides a method of forming a field-effect transistor that includes separating first and second conductive layers of the field-effect transistor with an interlayer dielectric layer, and electrically connecting the first and second conductive layers using opposing conductive straps formed on either side of the first and second conductive layers and interlayer dielectric layer, thereby forming a control gate of the field-effect transistor.

For another embodiment, the invention provides a method of forming a floating-gate field-effect transistor. The method includes forming a tunnel dielectric layer overlying a substrate; forming a first conductive layer overlying the tunnel dielectric layer; forming an interlayer dielectric layer overlying the first conductive layer; forming a second conductive layer overlying the interlayer dielectric layer; forming a cap layer overlying the second conductive layer; patterning the cap layer and the second conductive layer to define a control gate of the floating-gate field-effect transistor; forming conductive straps on sidewalls of the control gate and coupled to the second conductive layer; removing portions of the interlayer dielectric layer, the first conductive layer and the tunnel dielectric layer adjacent the sidewalls of the control gate; and forming source and drain regions in the substrate adjacent the sidewalls of the control gate.

For another embodiment, the invention provides a method of forming a portion of a memory device. The method includes forming a first structure corresponding to a field-effect transistor and a plurality of second structures, each second structure corresponding to a floating-gate memory cell. The first structure and the second structures overlay a first dielectric layer formed on a first conductive layer. The first conductive layer is formed on a second dielectric layer that is formed on a substrate. The first structure and each of the second structures include a second conductive layer formed on the first dielectric layer, a third conductive layer formed on the second conductive layer, and a cap layer formed on the third conductive layer. Masking the second structures and portions of the first dielectric layer adjacent the second structures so as to leave portions of the first dielectric layer adjacent the first structure exposed is included in the method, as is removing the exposed portions of the first dielectric layer, thereby exposing portions of the first conductive layer adjacent the first structure. The method includes forming a fourth conductive layer overlying the exposed portions of the first conductive layer adjacent the first structure, the first structure, the second structures, and the portions of the first dielectric layer adjacent the second structures. Selectively removing the fourth conductive layer so a portion of the fourth conductive layer remains on opposing sidewalls of the first structure and on opposing sidewalls of each of the second structures is included in the method. The portion of the fourth conductive layer remaining on the opposing sidewalls of the first structure forms opposing first conductive straps that extend substantially from an upper surface of the cap layer of the first structure to the first conductive layer adjacent the first structure, thereby electrically interconnecting the first conductive layer and the second conductive layer of the first structure. The portion of the fourth conductive layer remaining on the opposing sidewalls of each of the second structures forms opposing second conductive straps that extend substantially from an upper surface of the cap layer of each of the second structures to the first dielectric layer adjacent each of the second structures. Removing any portions of the first dielectric layer not underlying the cap layer of each of the second structures and not underlying the second conductive straps of each of the second structures is included in the method. The method includes removing any portions of the first conductive layer not underlying the cap layer of the first structure and each of the second structures and not underlying the first conductive straps of the first structure and the second conductive straps of each of the second structures.

For another embodiment, the invention provides a method of concurrently forming a field-effect transistor and a floating-gate field-effect transistor in an integrated circuit device. The method includes forming a first dielectric layer overlying a substrate of the integrated circuit device, forming a first conductive layer overlying the first dielectric layer, forming a second dielectric layer overlying the first conductive layer, and forming a second conductive layer overlying the second dielectric layer. The method includes removing portions of the second conductive layer to define control gates for the field-effect transistor and the floating-gate field-effect transistor. Removing portions of the second dielectric layer adjacent the control gate of the field-effect transistor while leaving portions of the second dielectric layer adjacent the control gate of the floating-gate field-effect transistor in place is included in the method. The method includes forming conductive straps overlying sidewalls of the control gates of the field-effect transistor and the floating-gate field-effect transistor. The conductive straps extend from the first conductive layer to at least the second conductive layer in the control gate of the field-effect transistor and from the second dielectric layer to at least the second conductive layer in the control gate of the floating-gate field-effect transistor. Removing the portions of the second dielectric layer adjacent the control gate of the floating-gate field-effect transistor and removing portions of the first conductive layer adjacent the field-effect transistor and the floating-gate field-effect transistor are also included in the method.

Further embodiments of the invention include methods and apparatus of varying scope.

BRIEF DESCRIPTION OF THE DRAWINGS

FIGS. 6A–6F are cross-sectional views of a portion of a memory device during various stages of fabrication according to an embodiment of the invention.

DETAILED DESCRIPTION

Figure 1:
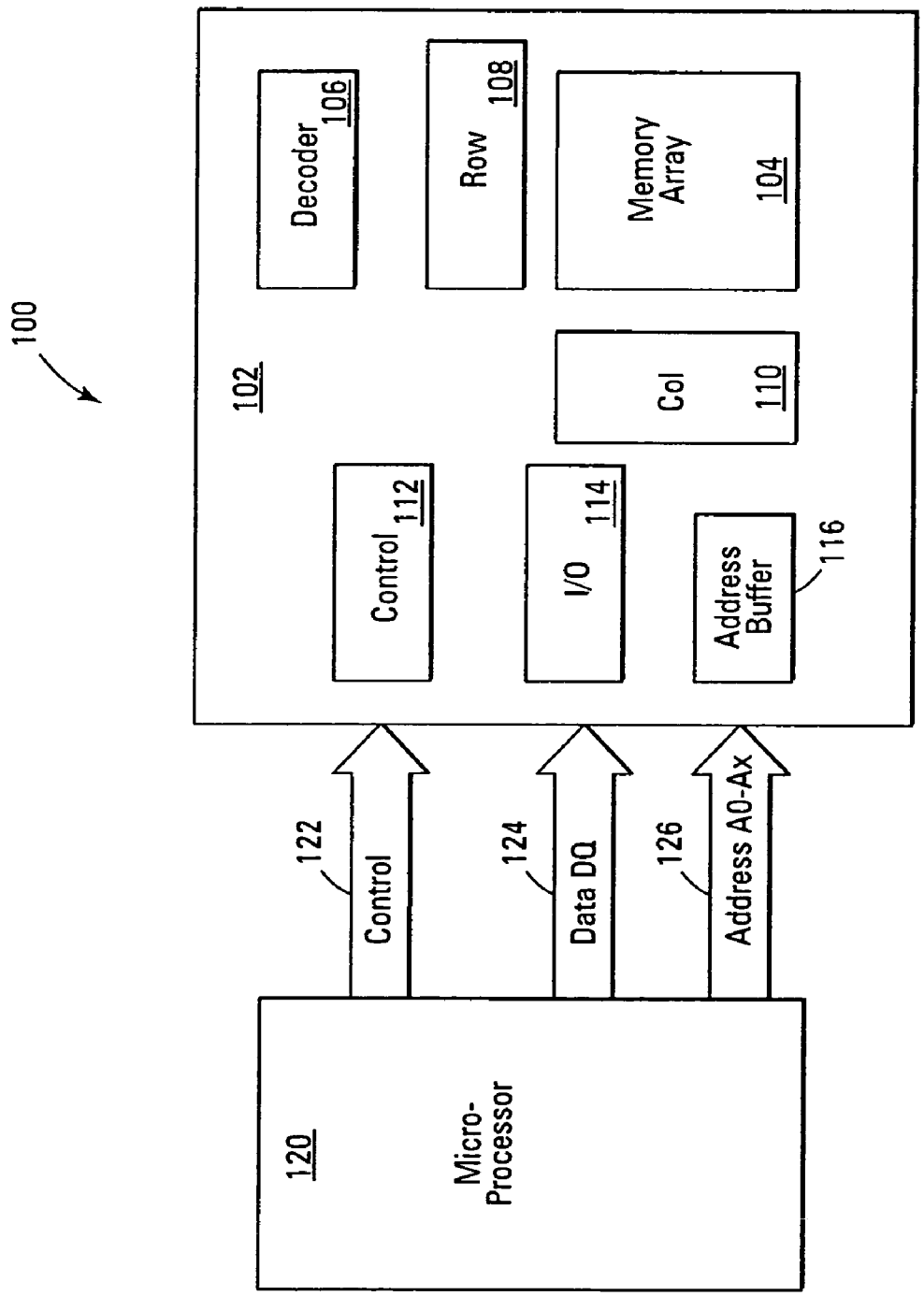
FIG. 1 is a simplified block diagram of a memory system according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting, sense, and the scope of the present invention is defined only by the appended claims and equivalents thereof.

FIG. 1 is a simplified block diagram of a memory system 100 according to an embodiment of the invention. Memory system 100 includes an integrated circuit flash memory device 102, e.g., a NAND or NOR memory device, that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
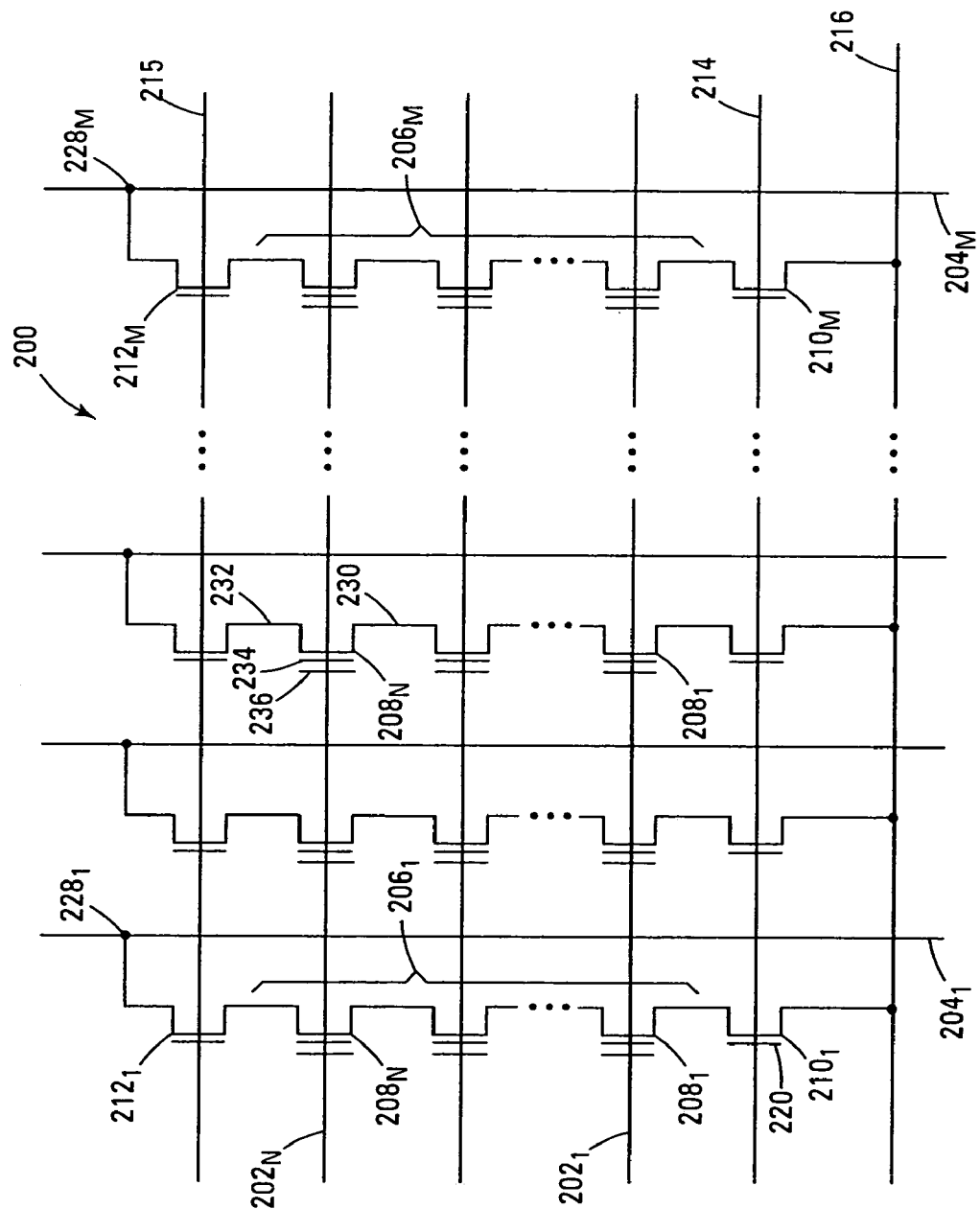
FIG. 2 is a schematic of a NAND memory array in accordance with another embodiment of the invention.

FIG. 2 illustrates a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 is a NAND string 206 coupled to a given local bit line 204. A row of the floating-gate transistors 208 are those transistors commonly coupled to a given word line 202.

Figure 3:
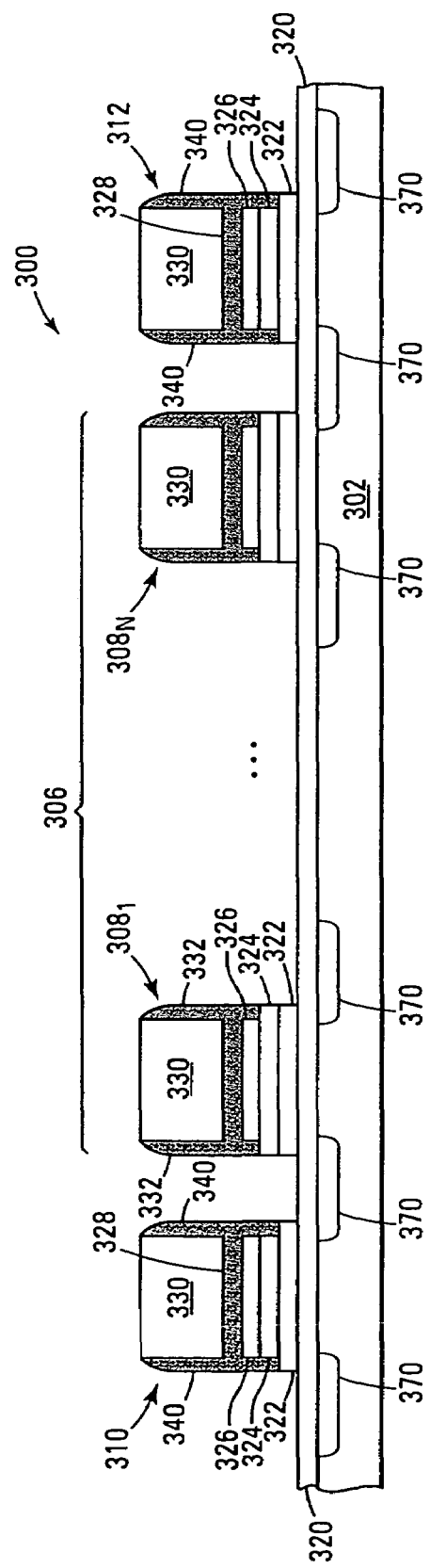
FIG. 3 is a cross-sectional view of a column of memory cells according to an embodiment of the present invention.

FIG. 3 is a cross-sectional view of a column 300 of memory cells, such as one of the columns NAND memory array 200 of FIG. 2, according to an embodiment of the present invention. Column 300 includes a string of memory cells (or floating-gate transistors) $308_1$ to $308_N$ connected in series to form a NAND string 306 on a substrate 302. A source select gate 310, such as a field-effect transistor (FET), is disposed on substrate 302 at one end of the NAND string 306. A drain select gate 312, such as a field-effect transistor (FET), is disposed on substrate 302 at the other end of the NAND string 306. A source/drain implant region (or layer) 370 is formed in substrate 302, as shown in FIG. 3. For one embodiment, source select gate 310 and memory cell $308_1$ share source/drain implant region 370, as do drain select gate 312 and memory cell $308_N$.

As is described below, for another embodiment of the invention, memory cells 308 and select gates 310 and 312 are formed concurrently and have common layers. Memory cells 308 and select gates 310 and 312 each include a dielectric layer 320, e.g., an oxide, disposed on substrate 302 that is of silicon or the like. For each of memory cells 308, dielectric layer 320 acts as a tunnel dielectric layer, while for select gates 310 and 312, dielectric layer 320 acts as a gate dielectric layer. Note that dielectric layer 320 may be a continuous layer that extends between memory cells 308 and select gates 310 and 312, and for one embodiment extends the entire length of the column. A first conductive (or polysilicon) layer 322 overlies dielectric layer 320, and an interlayer dielectric layer 324, such as an oxide-nitride-oxide (ONO) layer, overlies the first conductive layer 322. A second conductive (or polysilicon) layer 326 is disposed on interlayer dielectric layer 324, and a third conductive layer 328, such as a refractory metal or refractory metal silicide layer, is disposed on the second conductive layer 326. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. For one embodiment, a protective cap layer 330, such as TEOS (tetraethylorthosilicate), overlies the third conductive layer 328. For one embodiment, the first conductive layer 322 and the second conductive layer 326 are conductively doped polysilicon layers.

For memory cells 308, the first conductive layer 322 is a floating gate layer, and second conductive layer 326 and third conductive layer 328 form a control gate (or word line). For one embodiment, the control gate (or word line) may be a single conductive layer of one or more conductive materials or three or more conductive layers. A conductive strap 332, e.g., of a refractory metal or refractory metal silicide, is disposed on opposing sides of each of the memory cells 308 laterally of and in contact with second conductive layer 326, third conductive layer 328, and protective cap layer 330. Straps 332 may be of any conductive material, but are preferably of a highly conductive material, such as metals or metal suicides. For one embodiment, straps 332 and the third conductive layer are of the same material. Straps 332 are substantially perpendicular to second conductive layer 326, third conductive layer 328, and protective cap layer 330. Straps 332 may extend substantially from an upper surface of protective cap layer 330 to interlayer dielectric layer 324, as shown in FIG. 3. Straps 332 increase the conductive cross-sectional area of the control gate (or word line) and thus act to reduce the resistance thereof. Straps 332 also can act to increase the bulk electrical conductivity of the control gate. For some embodiments, straps 332 extend the entire length of the word line, such as the word lines 202 of FIG. 2, e.g., the entire length of the memory array, such as NAND memory array 200 of FIG. 2. That is, straps 332 span two or more columns of memory cells (or NAND strings).

For select gates 310 and 312, a conductive strap 340, e.g., of a refractory metal or a refractory metal silicide, is disposed on opposing sides of each of the select gates 310 and 312 laterally of interlayer dielectric layer 324, second conductive layer 326, third conductive layer 328, and protective cap layer 330. Straps 340 may be of any conductive material, but are preferably of a highly conductive material, such as metals or metal silicides. For one embodiment, straps 340 and the third conductive layer are of the same material. Straps 340 are in contact with the third conductive layer 328 and are substantially perpendicular to interlayer dielectric layer 324, second conductive layer 326, third conductive layer 328, and protective cap layer 330. Straps 340 may extend substantially from an upper surface of protective cap layer 330 to first conductive layer 322, as shown in FIG. 3. In this way, straps 340 electrically interconnect the first and second conductive layers so as to short the first and second conductive layers together. Shorting the first and second conductive layers together eliminates the floating gate, which is not needed for operation of select gates 310 and 312. For some embodiments, straps 340 extend the entire length of the memory array, such as NAND memory array 200 of FIG. 2. That is, straps 340 span two or more columns of the array.

For source select gate 310, in one embodiment, the shorted-together first and second conductive layers and the third conductive layer form a control gate or a source select line, such as the source select line 214 of FIG. 2. For drain select gate 312, in one embodiment, the shorted-together first and second conductive layers and the third conductive layer form a control gate or a drain select line, such as the drain select line 215 of FIG. 2. The first and second conductive layers of such source and drain select lines are shorted together along the entire length of the respective select lines so that the respective select lines have lower resistances than select lines having first and second conductive layers that are shorted together at a single region. For one embodiment, the control gate (or select line) may be a single conductive layer of one or more conductive materials or three or more conductive layers.

Figure 4:
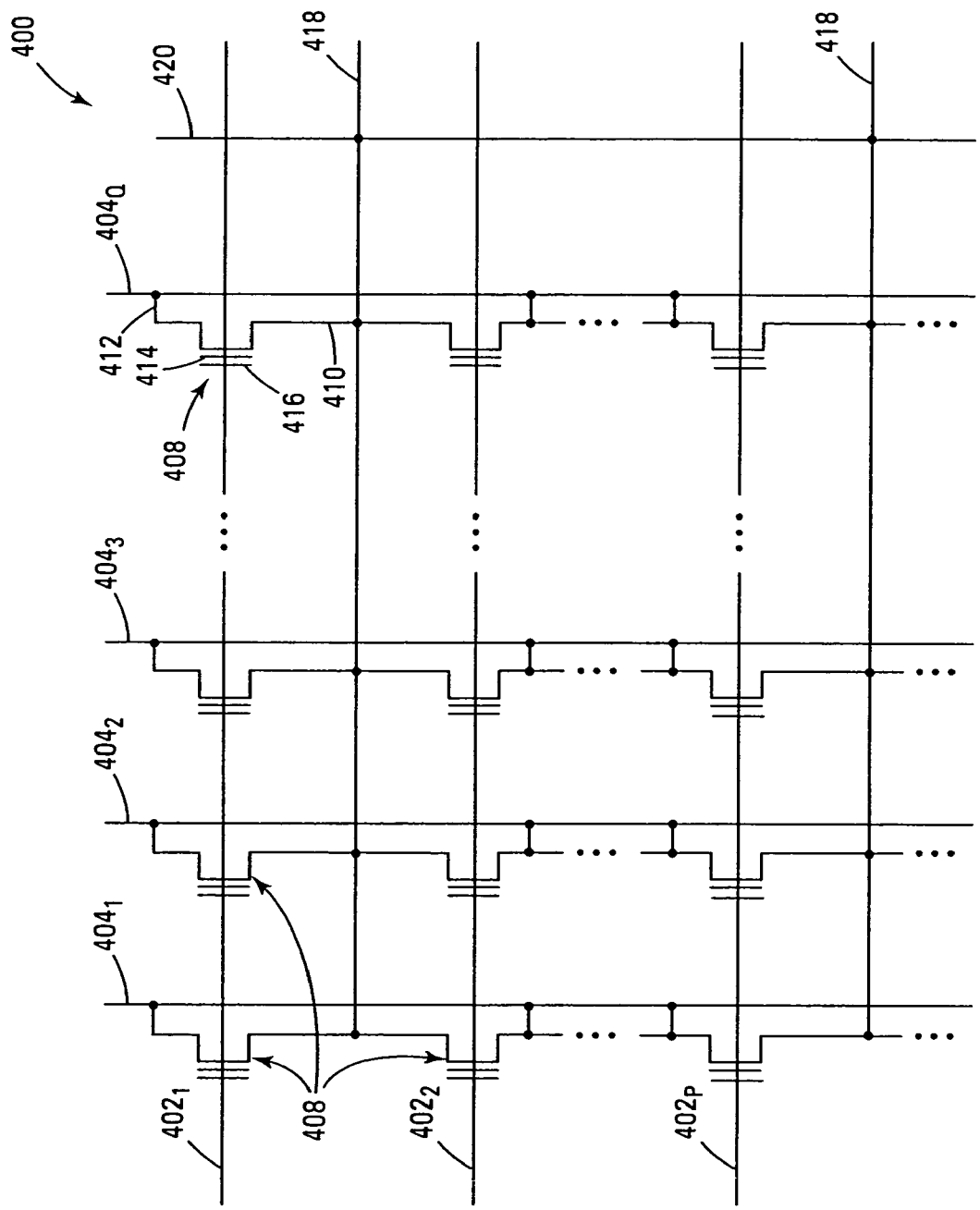
FIG. 4 is a schematic of a NOR memory array in accordance with another embodiment of the invention.

FIG. 4 illustrates a NOR memory array 400 as a portion of memory array 104 of FIG. 1 in accordance with another embodiment of the invention. Memory array 400 includes word-lines $402_1$ to $402P$ and intersecting local bit-lines $404_1$ to $404_Q$. For ease of addressing in the digital environment, the number of word-lines 402 and the number of bit-lines 404 are each some power of two, e.g., 256 word-lines 402 by 4,096 bit-lines 404. The local bit-lines 404 are coupled to global bit-lines (not shown) in a many-to-one relationship.

Floating-gate transistors 408 are located at each intersection of a word-line 402 and a local bit-line 404. The floating-gate transistors 408 represent non-volatile memory cells for storage of data. Typical construction of such floating-gate transistors 408 include a source 410 and a drain 412 constructed from an N+-type material of high impurity concentration formed in a P-type semiconductor substrate of low impurity concentration, a channel region formed between the source 410 and drain 412, a floating gate 414, and a control gate 416.

Floating-gate transistors 408 having their control gates 416 coupled to a word-line 402 typically share a common source depicted as array source 418. As shown in FIG. 4, floating-gate transistors 408 coupled to two adjacent word-lines 402 may share the same array source 418. Floating-gate transistors 408 have their drains 412 coupled to a local bit-line 404. A column of the floating-gate transistors 408 includes those transistors commonly coupled to a given local bit-line 404. A row of the floating-gate transistors 408 includes those transistors commonly coupled to a given word-line 402.

To reduce problems associated with high resistance levels in the array source 418, the array source 418 is regularly coupled to a metal or other highly conductive line to provide a low-resistance path to ground. The array ground 420 serves as this low-resistance path.

Figure 5:
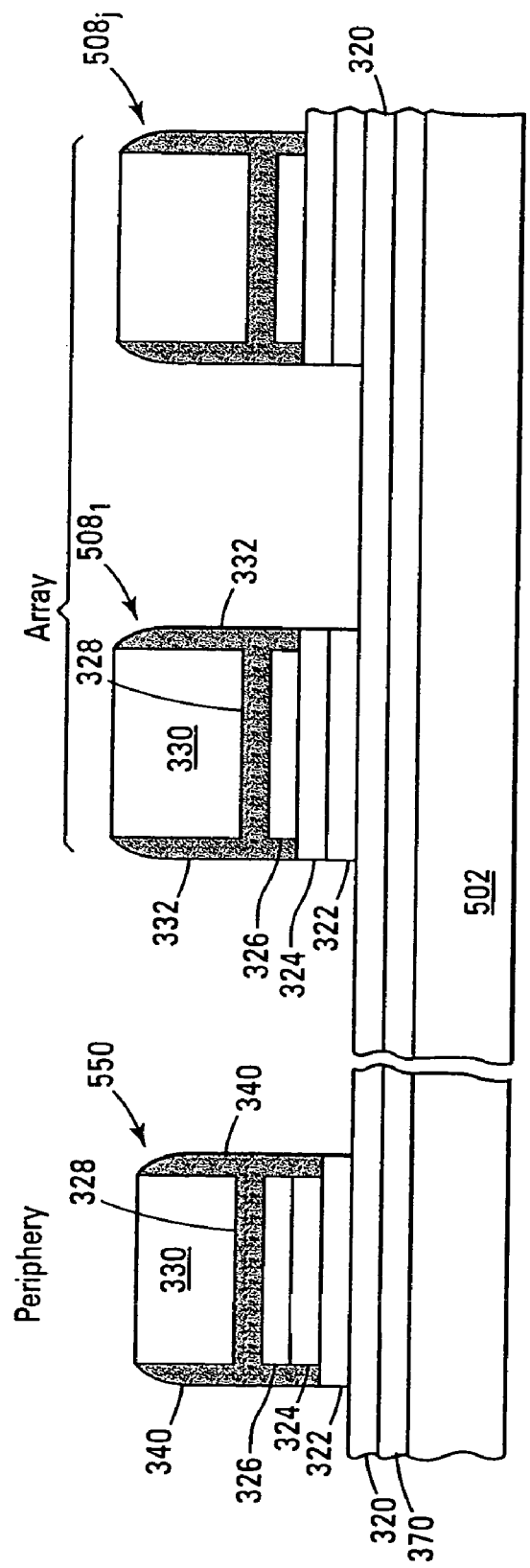
FIG. 5 is a cross-sectional view of a portion of a memory device according to another embodiment of the present invention.

FIG. 5 is a cross-sectional view of a portion of a memory device, such as a NOR memory device, according to another embodiment of the present invention. Floating-gate transistors $508_1$ to $508j$ formed on a substrate 502, e.g., a silicon substrate or the like, are representative of the floating-gate memory cells of a NOR memory array, such as one of the floating-gate transistors 408 of NOR memory array 400 of FIG. 4. A field-effect transistor 550 is located at a periphery of the NOR memory array. For one embodiment, field-effect transistor 550 is a representative one of a plurality of field-effect transistors 550 that are located about the periphery of the NOR memory array and that are electrically connected to the NOR memory array for controlling operation of the NOR memory array. For example, these field-effect transistors can be part of row access circuitry 108 and/or column access circuitry 110 of the memory device 102 of FIG. 1 for accessing rows and columns of the memory array 104.

As is described below, for another embodiment of the invention, floating-gate transistors 508 and field-effect transistor 550 are formed concurrently and have common layers. For one embodiment, floating-gate transistors 508 are as described above for floating-gate transistors 308 of FIG. 3, and thus the elements of floating-gate transistors 508 and the floating-gate transistors 308 are commonly numbered. For another embodiment, field-effect transistor 550 is as described above for the select gates 310 and 312 of FIG. 3, and thus the elements of field-effect transistor 550 and the select gates 310 and 312 are commonly numbered.

For one embodiment, straps 332 of floating-gate transistor 508 extend the entire length of the word line, such as the word lines 402 of FIG. 4, e.g., the entire length of the memory array, such as NOR memory array 400 of FIG. 4. That is, straps 332 of floating-gate transistor 508 span two or more columns of memory cells.

FIGS. 6A–6F generally depict a method of forming a portion of a memory device, such as a NAND or a NOR flash memory device, in accordance with an embodiment of the invention. In particular, FIGS. 6A–6F illustrate concurrent formation of floating-gate transistors $608_1$ to $608_i$ (shown in FIG. 6F) and a field-effect transistor 610 (shown in FIG. 6F). For one embodiment, floating-gate transistors $608_1$ to $608_i$ correspond to a NAND string, such as floating-gate transistors 308 of FIG. 3, and field-effect transistor 610 corresponds to select gates connected to either end of the NAND string, such as the select gates 310 and 312 of FIG. 3. For another embodiment, floating-gate transistors $608_1$ to $608_i$ are part of a NOR array, such as NOR array 400 of FIG. 4, and field-effect transistor 610 corresponds to a field-effect transistor disposed at the periphery of the NOR array, such as field-effect transistor 550 of FIG. 5.

FIG. 6A depicts a portion of the memory device after several processing steps have occurred. Layers of the structure depicted in FIG. 6A and the layers of FIGS. 3 and 5 are commonly numbered and are described above. The dielectric layer 320 is formed on a substrate 600, e.g., of silicon. The first conductive (or polysilicon) layer 322 is formed on dielectric layer 320, and the interlayer dielectric layer 324 is formed on the first conductive layer 322. The second conductive (or polysilicon) layer 326 is then formed on the interlayer dielectric layer 324, and the third conductive layer 328 is subsequently formed on the second conductive layer 326. Next, the protective cap layer 330 is formed on the third conductive layer 328. Subsequently, the structure of FIG. 6A, including structures corresponding to the future floating-gate transistors 608 (to be referred to as floating-gate transistors 608) and the future field-effect transistor 610 (to be referred to as field-effect transistor 610), is formed by removing portions of the protective cap layer 330, the third conductive layer 328, and the second conductive layer 326. Formation of a structure of the type depicted in FIG. 6A is well understood and will not be detailed further herein.

In FIG. 6B, a mask layer 620 is formed on floating-gate transistors 608, on the interlayer dielectric layer 324 that lies between successive floating-gate transistors 608, and on a portion 622 of interlayer dielectric layer 324 that lies between floating-gate transistors 608 and field-effect transistor 610 and is adjacent to a sidewall 623 of floating-gate transistor $608_1$. Field-effect transistor 610 is not masked.

The remaining portion 624 of interlayer dielectric layer 324 that lies between floating-gate transistors 608 and field-effect transistor 610 and is adjacent to a sidewall 626 of field-effect transistor 610 is not masked, as is a portion 628 of interlayer dielectric layer 324 that is adjacent a sidewall 630 of field-effect transistor 610 that is opposite the sidewall 626. As one example, the mask layer 620 is a photoresist layer as is commonly used in semiconductor fabrication.

Figure 6C:
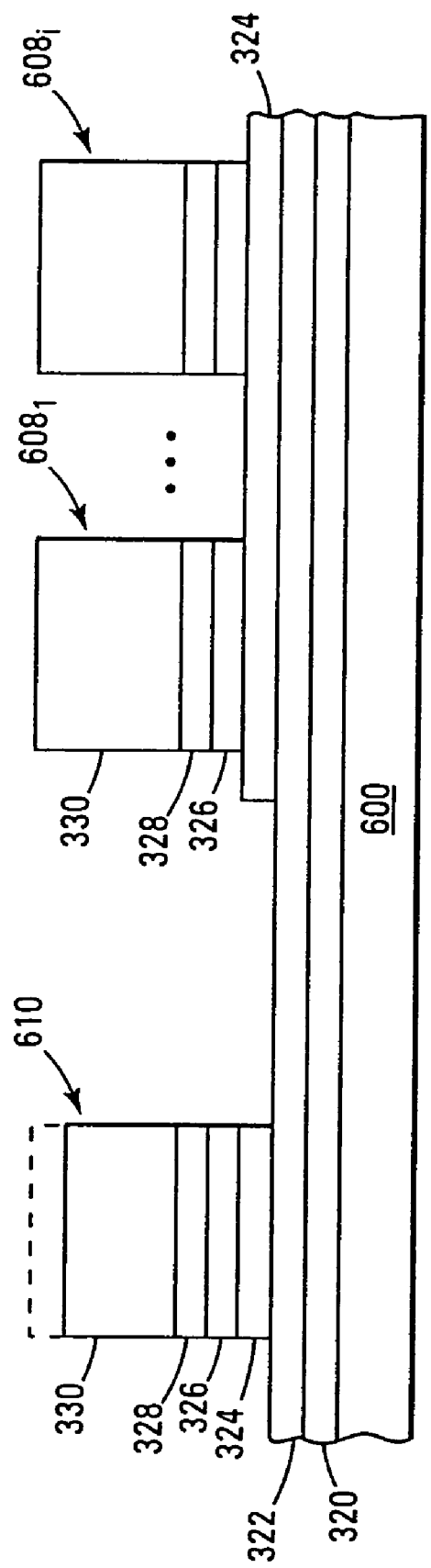

The exposed region of the interlayer dielectric layer 324, i.e., the unmasked or exposed portions 624 and 628 of the interlayer dielectric layer 324, is then removed, such as by plasma etching, followed by removal of mask layer 670, as shown in FIG. 6C. Note that cap layer 330 of field-effect transistor 610 masks the layers of field-effect transistor 610 that are in line with and underlying cap layer 330, and thus prevents the removal of these layers during etching. However, for some embodiments, a portion of the cap layer 330 of field-effect transistor 610 is etched away as indicated by the dashed line in FIG. 6C. Therefore, it is preferable that cap layer 330 be thick enough to cover the layers of field-effect transistor 610 that are in line with and underlying cap layer 330 throughout processing.

Figure 6D:
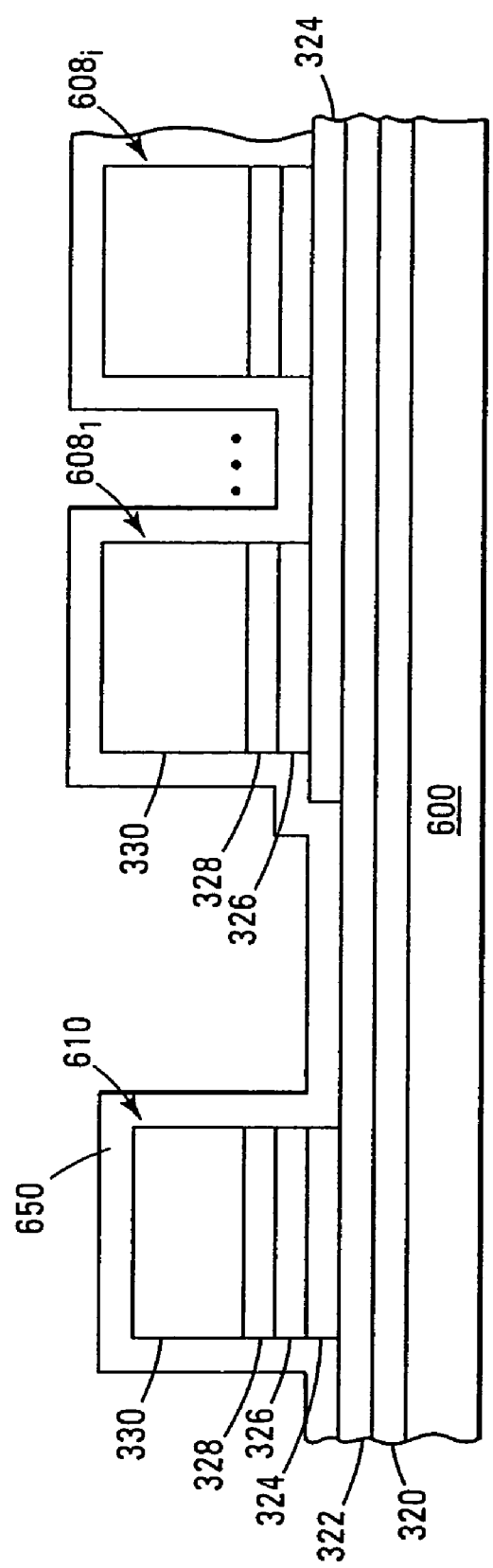
Figure 6E:
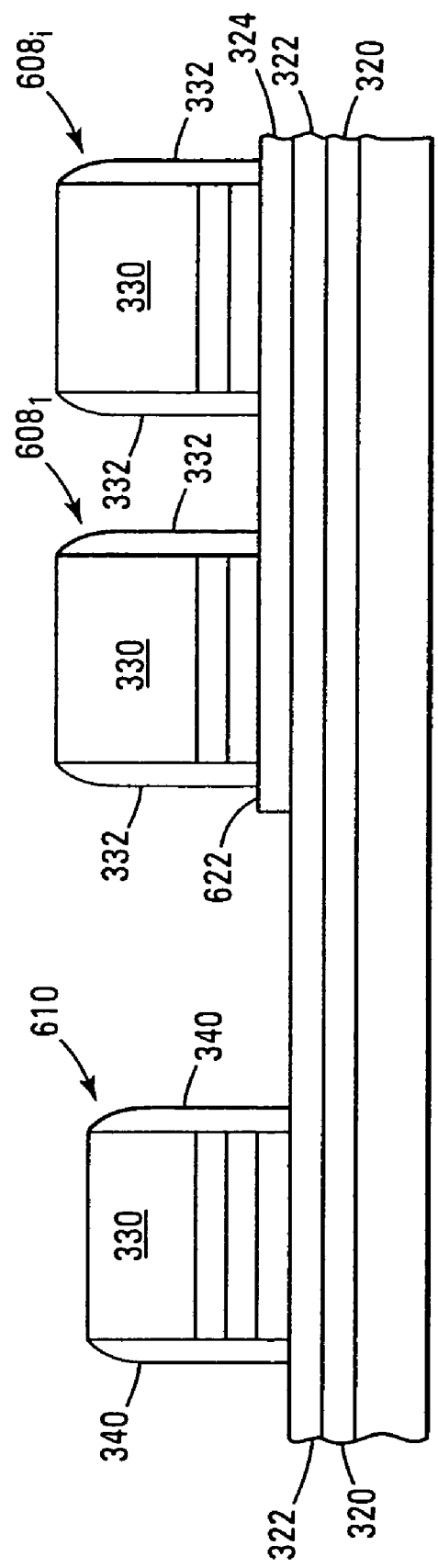

A fourth conductive layer 650, e.g., a refractory metal silicide layer, is formed over the structure of FIG. 6C, as shown in FIG. 6D, e.g., using CVD. In addition to CVD, physical vapor deposition (PVD), e.g., sputtering, can be used. A subsequent anisotropic etch removes portions of the conductive layer 650 from the structure of FIG. 6D. The result of this etch is seen in FIG. 6E. That is, the etch leaves the straps 332 on opposing sidewalls of the floating-gate transistors 608 and the straps 340 on opposing sidewalls of field-effect transistor 610.

Figure 6F:
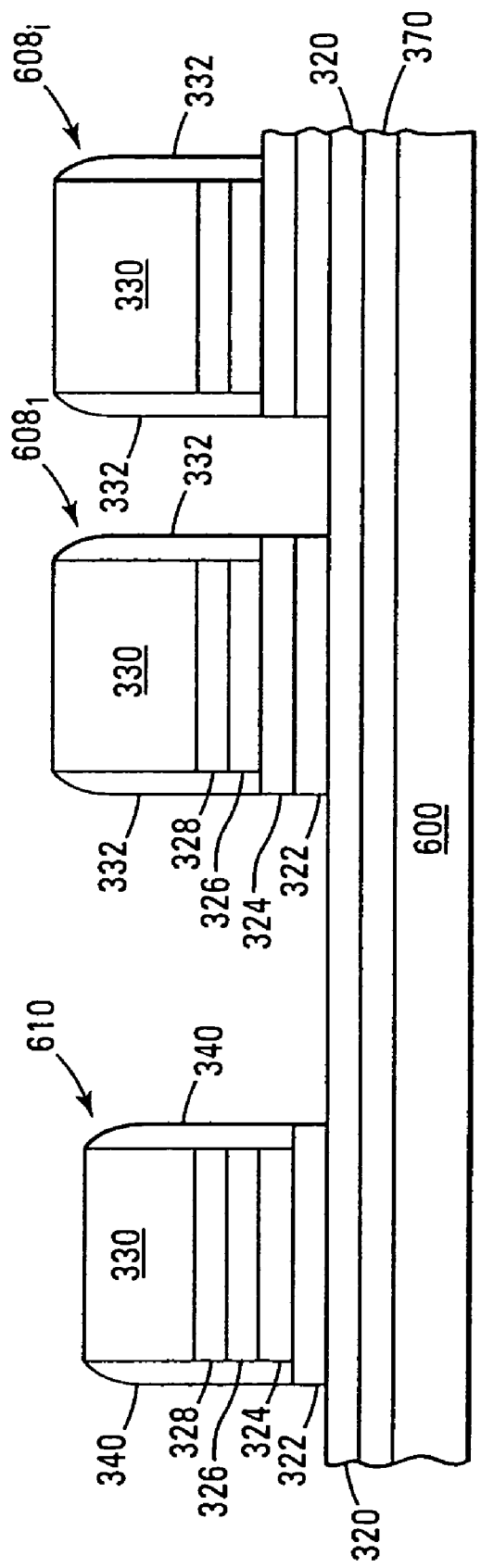

One or more anisotropic etches are performed of the structure of FIG. 6E to form the structure of FIG. 6F. This removes the interlayer dielectric layer 324 that lies between successive floating-gate transistors 608 and the portion 622 of interlayer dielectric layer 324 that lies between floating-gate transistors 608 and field-effect transistor 610. That is, the etch removes any remaining portions of interlayer dielectric layer 324 that are not located under the cap layers 330 and the straps 332 of floating-gate transistors 608. The etch also removes any portion of the first conductive (or polysilicon) layer 322 not located under the cap layers 330 and the straps 332 of floating-gate transistors 608 and the cap layer 330 and the straps 340 of field-effect transistor 610. For this etch, cap layers 330 and the straps 332 and 340 act as masks and no additional masking layer is necessary. For one embodiment, source/drain implant region 370 is then formed in substrate 600 of the structure of FIG. 6F. For another embodiment, source/drain implant region 370 may be formed in substrate 600 prior to depositing dielectric layer 320.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a field-effect transistor, comprising:
   separating first and second conductive layers of the field-effect transistor with an interlayer dielectric layer; and
   electrically connecting the first and second conductive layers using opposing conductive straps formed on either side of the first and second conductive layers and interlayer dielectric layer, thereby forming a control gate of the field-effect transistor.

2. The method of claim 1, wherein the first and second conductive layers are of polysilicon.

3. The method of claim 1, wherein each strap comprises metal.

4. The method of claim 1, further comprising forming the first conductive layer on a gate dielectric layer overlying a substrate.

5. The method of claim 4, further comprising forming a metal-containing layer overlying the second conductive layer before forming the opposing straps.

6. The method of claim 5, further comprising forming a cap layer on the metal-containing layer before forming the opposing straps.

7. A method of forming a field-effect transistor, comprising:
   forming a first dielectric layer on a substrate;
   forming a first polysilicon layer on the first dielectric layer;
   forming a second dielectric layer on the first polysilicon layer;
   forming a second polysilicon layer on the second dielectric layer;
   forming a metal-containing layer on the second polysilicon layer;
   forming a cap layer on the metal-containing layer;
   patterning the cap layer, second conductive layer, and second dielectric layer to define a control gate of the field-effect transistor; and
   forming a conductive strap on each opposing sidewalls of the control gate so that each strap electrically interconnects the first and second polysilicon layers.

8. A method of forming a field-effect transistor, comprising:
   forming a gate dielectric layer overlying a substrate;
   forming a first conductive layer overlying the gate dielectric layer;
   forming an interlayer dielectric layer overlying the first conductive layer;
   forming a second conductive layer overlying the interlayer dielectric layer;
   forming a cap layer overlying the second conductive layer;
   patterning the cap layer, second conductive layer and interlayer dielectric layer to define a control gate of the field-effect transistor;
   forming conductive straps on sidewalls of the control gate and coupled to at least the first conductive layer and the second conductive layer;
   removing portions of the first conductive layer and the gate dielectric layer adjacent the sidewalls of the control gate; and
   forming source and drain regions in the substrate adjacent the sidewalls of the control gate.

9. A method of forming a floating-gate field-effect transistor, comprising:
   forming a tunnel dielectric layer overlying a substrate;
   forming a first conductive layer overlying the tunnel dielectric layer;
   forming an interlayer dielectric layer overlying the first conductive layer;
   forming a second conductive layer overlying the interlayer dielectric layer;
   forming a cap layer overlying the second conductive layer;
   patterning the cap layer and the second conductive layer to define a control gate of the floating-gate field-effect transistor;
   forming conductive straps on sidewalls of the control gate and coupled to the second conductive layer;
   removing portions of the interlayer dielectric layer, the first conductive layer and the tunnel dielectric layer adjacent the sidewalls of the control gate; and
   forming source and drain regions in the substrate adjacent the sidewalls of the control gate.

10. A method of concurrently forming a field-effect transistor and a floating-gate field-effect transistor in an integrated circuit device, the method comprising:
    forming a first dielectric layer overlying a substrate of the integrated circuit device;
    forming a first conductive layer overlying the first dielectric layer;
    forming a second dielectric layer overlying the first conductive layer;
    forming a second conductive layer overlying the second dielectric layer;
    removing portions of the second conductive layer to define control gates for the field-effect transistor and the floating-gate field-effect transistor;
    removing portions of the second dielectric layer adjacent the control gate of the field-effect transistor while leaving portions of the second dielectric layer adjacent the control gate of the floating-gate field-effect transistor in place;
    forming conductive straps overlying sidewalls of the control gates of the field-effect transistor and the floating-gate field-effect transistor, wherein the conductive straps extend from the first conductive layer to at least the second conductive layer in the control gate of the field-effect transistor and from the second dielectric layer to at least the second conductive layer in the control gate of the floating-gate field-effect transistor;
    removing the portions of the second dielectric layer adjacent the control gate of the floating-gate field-effect transistor; and
    removing portions of the first conductive layer adjacent the field-effect transistor and the floating-gate field-effect transistor.

11. The method of claim 10, further comprising forming a cap layer on the second conductive layer.

12. The method of claim 11, wherein the conductive straps extend to the cap layer.

13. The method of claim 10, wherein the first conductive layer is a polysilicon layer.

14. The method of claim 13, wherein the polysilicon layer is a conductively doped polysilicon layer.

15. The method of claim 10, wherein the second conductive layer comprises more than one conductive material.

16. The method of claim 10, wherein the second conductive layer comprises a metal-containing layer overlying a polysilicon layer.

17. The method of claim 16, wherein the metal-containing layer is a metal silicide layer.

18. The method of claim 10, wherein forming the conductive straps comprises blanket depositing conductive material and anisotropically removing portions of the conductive material to leave the straps on the sidewalls.

19. A method of concurrently forming a field-effect transistor and a floating-gate field-effect transistor in an integrated circuit device, the method, comprising:
forming a first dielectric layer overlying a substrate of the integrated circuit device;
forming a first polysilicon layer overlying the first dielectric layer;
forming a second dielectric layer overlying the first polysilicon layer;
forming a second polysilicon layer overlying the second dielectric layer;
forming a metal-containing layer overlying the second polysilicon layer;
forming a cap layer overlying the metal-containing layer;
removing portions of the second polysilicon layer, the metal-containing layer, and the cap layer to define control gates for the field-effect transistor and the floating-gate field-effect transistor;
removing portions of the second dielectric layer adjacent the control gate of the field-effect transistor while leaving portions of the second dielectric layer adjacent the control gate of the floating-gate field-effect transistor in place;
blanket depositing conductive material and anisotropically removing portions of the conductive material to leave conductive straps overlying sidewalls of the control gates of the field-effect transistor and the floating-gate field-effect transistor, wherein the conductive straps extend from the first polysilicon layer to at least the second polysilicon layer in the control gate of the field-effect transistor and from the second dielectric layer to at least the second polysilicon layer in the control gate of the floating-gate field-effect transistor;
removing the portions of the second dielectric layer adjacent the control gate of the floating-gate field-effect transistor; and
removing portions of the first polysilicon layer adjacent the field-effect transistor and the floating-gate field-effect transistor.

20. A method of forming a portion of a NAND memory array, comprising:
forming a plurality of columns of NAND strings of memory cells connected to select gates, the select gates of the respective columns interconnected by a select line, wherein forming each of the select gates and the select line comprises:
separating first and second conductive layers of each of the select gates and the select line with an interlayer dielectric layer; and
electrically connecting the first and second conductive layers using opposing conductive straps formed on either side of the first and second conductive layers and interlayer dielectric layer, the pair of opposing straps spanning two or more of the plurality of columns.

21. The method of claim 20, further comprising forming the first conductive layer on a gate dielectric layer overlying a substrate.

22. The method of claim 21, further comprising forming a metal-containing layer overlying the second conductive layer before forming the opposing straps.

23. The method of claim 22, further comprising forming a cap layer on the metal-containing layer before forming the opposing straps.

24. A method of forming a portion of a NAND memory array, comprising:
forming a plurality of columns of NAND strings of memory cells connected between source select gates and drain select gates, wherein forming each of the source and drain select gates and each of the memory cells comprises:
forming a first dielectric layer on a substrate;
forming a first polysilicon layer on the first dielectric layer;
forming a second dielectric layer on the first polysilicon layer;
forming a second polysilicon layer on the second dielectric layer;
forming a metal-containing layer on the second polysilicon layer; and
forming a cap layer on the metal-containing layer;
wherein forming each of the source and drain select gates further comprises forming a pair of opposing first conductive straps on each of opposing sidewalls of each of the source and drain select gates, wherein each first conductive strap electrically interconnects the first and second polysilicon layers, the pair of opposing first conductive straps spanning two or more of the plurality of columns; and
wherein forming each of the memory cells further comprises forming a pair of opposing second conductive straps on each of opposing sidewalls of each of the memory cells, wherein each second conductive strap contacts the metal-containing layer and the second polysilicon layer and extends from substantially an upper surface of the cap layer to the second dielectric layer, the pair of opposing second conductive straps spanning two or more of the plurality of columns.

25. A method of forming a portion of a memory device, comprising:
forming a first structure corresponding to a field-effect transistor and a plurality of second structures, each second structure corresponding to a floating-gate memory cell, wherein the first structure and the second structures overlay a first dielectric layer formed on a first conductive layer, the first conductive layer formed on a second dielectric layer that is formed on a substrate, the first structure and each of the second structures comprising:
a second conductive layer formed on the first dielectric layer;
a third conductive layer formed on the second conductive layer; and
a cap layer formed on the third conductive layer;
masking the second structures and portions of the interlayer dielectric layer adjacent the second structures so as to leave portions of the first dielectric layer adjacent the first structure exposed;
removing the exposed portions of the first dielectric layer, thereby exposing portions of the first conductive layer adjacent the first structure;
forming a fourth conductive layer overlying the exposed portions of the first conductive layer adjacent the first structure, the first structure, the second structures, and the portions of the first dielectric layer adjacent the second structures;

selectively removing the fourth conductive layer so a portion of the fourth conductive layer remains on opposing sidewalls of the first structure and on opposing sidewalls of each of the second structures, wherein the portion of the fourth conductive layer remaining on the opposing sidewalls of the first structure forms opposing first conductive straps that extend substantially from an upper surface of the cap layer of the first structure to the first conductive layer adjacent the first structure, thereby electrically interconnecting the first conductive layer and the second conductive layer of the first structure, and wherein the portion of the fourth conductive layer remaining on the opposing sidewalls of each of the second structures forms opposing second conductive straps that extend substantially from an upper surface of the cap layer of each of the second structures to the first dielectric layer adjacent each of the second structures;

removing any portions of the first dielectric layer not underlying the cap layer of each of the second structures and not underlying the second conductive straps of each of the second structures; and removing any portions of the first conductive layer not underlying the cap layer of the first structure and each of the second structures and not underlying the first conductive straps of the first structure and the second conductive straps of each of the second structures.

26. The method of claim 25, wherein the first and second conductive layers are polysilicon layers.

27. The method of claim 25, wherein the third conductive layer comprises a refractory metal silicide.

28. The method of claim 25, wherein the fourth conductive layer of a refractory metal silicide.

29. The method of claim 25, wherein cap layer is a layer of tetraethylorthosilicate.

30. The method of claim 25, wherein selectively removing the fourth conductive layer further comprises an anisotropic etch.

* * * * *